United States Patent
Nagata (10) Patent No.: US 12,009,392 B2
(45) Date of Patent: Jun. 11, 2024

(54) SEMICONDUCTOR DEVICE WITH REDUCED WITHSTAND VOLTAGE FLUCTUATIONS

(71) Applicant: ROHM CO., LTD., Kyoto (JP)

(72) Inventor: Masaki Nagata, Kyoto (JP)

(73) Assignee: ROHM CO., LTD., Kyoto-Shi (JP)

( * ) Notice: Subject to any disclaimer, the term of this patent is extended or adjusted under 35 U.S.C. 154(b) by 0 days.

(21) Appl. No.: 17/911,656

(22) PCT Filed: Mar. 9, 2021

(86) PCT No.: PCT/JP2021/009151
§ 371 (c)(1),
(2) Date: Sep. 15, 2022

(87) PCT Pub. No.: WO2021/199949
PCT Pub. Date: Oct. 7, 2021

(65) Prior Publication Data
US 2023/0178604 A1   Jun. 8, 2023

(30) Foreign Application Priority Data

Mar. 30, 2020   (JP) ................................. 2020-060630

(51) Int. Cl.
*H01L 29/06*   (2006.01)
*H01L 29/78*   (2006.01)

(52) U.S. Cl.
CPC ...... *H01L 29/0688* (2013.01); *H01L 29/0607* (2013.01); *H01L 29/7811* (2013.01)

(58) Field of Classification Search
CPC ............. H01L 29/0688; H01L 29/0607; H01L 29/7811; H01L 29/1095; H01L 29/0634;
(Continued)

(56) References Cited

U.S. PATENT DOCUMENTS

| 2008/0246079 A1* | 10/2008 | Saito | ................... H01L 29/0878 257/E29.001 |
| 2009/0273031 A1* | 11/2009 | Saito | ................... H01L 29/0634 257/E29.257 |

(Continued)

FOREIGN PATENT DOCUMENTS

| JP | 2008-258442 A | 10/2008 |
| JP | 2009-272397 A | 11/2009 |

OTHER PUBLICATIONS

International Search Report and Written Opinion mailed on Jun. 8, 2021, received for PCT Application PCT/JP2021/009151, filed on Mar. 9, 2021, 13 pages including English Translation.

*Primary Examiner* — Shahed Ahmed
(74) *Attorney, Agent, or Firm* — XSENSUS LLP (57) ABSTRACT

A semiconductor device includes a semiconductor chip having a main surface, a first conductivity type drift region formed in a surface layer portion of the main surface, and a second conductivity type column region formed in a column shape extending in the thickness direction in the drift region, the column region having a lower end portion, an intermediate portion and an upper end portion, wherein the column region has a compensation region including a low concentration portion which is formed between the lower end portion and the intermediate portion, and a high concentration portion which is formed between the intermediate portion and the upper end portion, the compensation region in which a charge balance is compensated within an impurity concentration range between the low concentration portion and the high concentration portion.

10 Claims, 7 Drawing Sheets

(58) Field of Classification Search
CPC ... H01L 29/7802; H01L 29/7833–7836; H01L 29/36–365; H01L 21/823493; H01L 21/823885
See application file for complete search history.

(56) References Cited

U.S. PATENT DOCUMENTS

| | | | |
|---|---|---|---|
| 2010/0025760 A1* | 2/2010 | Kawashima | H01L 29/7808 257/334 |
| 2011/0018101 A1 | 1/2011 | Omori | |
| 2015/0076600 A1* | 3/2015 | Jun | H01L 29/1095 257/339 |

* cited by examiner

SEMICONDUCTOR DEVICE WITH REDUCED WITHSTAND VOLTAGE FLUCTUATIONS

CROSS-REFERENCE TO RELATED APPLICATIONS

The present application is based on PCT filing PCT/JP2021/009151, filed Mar. 9, 2021, which corresponds to Japanese Patent Application No. 2020-060630 filed on Mar. 30, 2020 in the Japan Patent Office, and the entire disclosure of this application is incorporated herein by reference.

TECHNICAL FIELD

The present invention relates to a semiconductor device.

BACKGROUND ART

Patent Literature 1 discloses a semiconductor device having a super junction structure (hereinafter, simply referred to as the "SJ structure"). The semiconductor device includes a semiconductor chip, an n-type drift region, and a p-type columnar region (column region). The drift region is formed in a surface layer portion of the semiconductor chip. The columnar region is formed in the drift region, and forms an SJ structure between the drift region and the columnar region.

CITATION LIST

Patent Literature

Patent Literature 1: United States Patent Application No. 2011/0018101 Specification

SUMMARY OF INVENTION

Technical Problem

In the SJ structure, a withstand voltage is maximized by achieving a charge balance between a column region having a fixed p-type impurity concentration and a drift region. A state where the charge balance is achieved indicates a state where a p-type charge amount (p-type impurity concentration) of the column region and an n-type charge amount (n-type impurity concentration) of the drift region are balanced. In the SJ structure, an allowable range of the column region for a process error (that is, a process margin) is extremely narrow. Thus, due to a process error generated in the column region, the withstand voltage is largely lowered.

For example, in a case where a width of the column region is increased more than a designed value, the p-type charge amount surpasses the n-type charge amount. In this case, an electric field is concentrated on a lower end portion of the column region, and the withstand voltage is lowered. Meanwhile, in a case where the width of the column region is decreased less than the designed value, the n-type charge amount surpasses the p-type charge amount. In this case, an electric field is concentrated on an upper end portion of the column region, and the withstand voltage is lowered. The process errors cause a decrease in a yield ratio.

Thus, one embodiment of the present invention provides a semiconductor device capable of suppressing fluctuations in withstand voltage due to a process error.

Solution to Problem

One embodiment of the present invention provides a semiconductor device including a semiconductor chip having a main surface, a first conductivity type drift region formed in a surface layer portion of the main surface, and a second conductivity type column region formed in a column shape extending in the thickness direction in the drift region, the column region having a lower end portion, an intermediate portion and an upper end portion, wherein the column region has a compensation region including a low concentration portion which is formed between the lower end portion and the intermediate portion, and a high concentration portion which is formed between the intermediate portion and the upper end portion, the compensation region in which a charge balance is compensated within an impurity concentration range between the low concentration portion and the high concentration portion.

According to the semiconductor device, even when a width of the column region is increased due to a process error, it is possible to ease an electric field concentration on the lower end portion of the column region by the low concentration portion of the compensation region. Meanwhile, even when the width of the column region is decreased due to the process error, it is possible to ease an electric field concentration on the upper end portion of the column region by the high concentration portion of the compensation region. Thereby, it is possible to suppress fluctuations in withstand voltage due to the process error.

One embodiment of the present invention provides a semiconductor device including a semiconductor chip having a main surface, a first conductivity type drift region formed in a surface layer portion of the main surface, and a second conductivity type column region formed in a column shape extending in the thickness direction in the drift region, the column region having a lower end portion, an intermediate portion and an upper end portion, wherein the column region has a lower compensation region including a low concentration portion which is formed between the lower end portion and the intermediate portion, and a lower high concentration portion which is formed between the low concentration portion and the lower end portion, the lower compensation region in which a charge balance is compensated within an impurity concentration range between the low concentration portion and the lower high concentration portion, and an upper compensation region including a high concentration portion which is formed between the intermediate portion and the upper end portion, and an upper low concentration portion which is formed between the high concentration portion and the upper end portion, the upper compensation region in which the charge balance is compensated within an impurity concentration range between the high concentration portion and the upper low concentration portion.

According to the semiconductor device, even when a width of the column region is increased due to a process error, it is possible to ease an electric field concentration on the lower end portion of the column region by the low concentration portion of the lower compensation region. Meanwhile, even when the width of the column region is decreased due to the process error, it is possible to ease the electric field concentration on the upper end portion of the column region by the high concentration portion of the upper compensation region. According to the semiconductor device, it is also possible to compensate the charge balance by the lower compensation region and the upper compensation region. Thereby, it is possible to suppress fluctuations in withstand voltage due to the process error.

The aforementioned as well as yet other objects, features, and effects of the present invention will be made clear by the following description of an embodiment with reference to the accompanying drawings.

DESCRIPTION OF EMBODIMENTS

Figure 1:
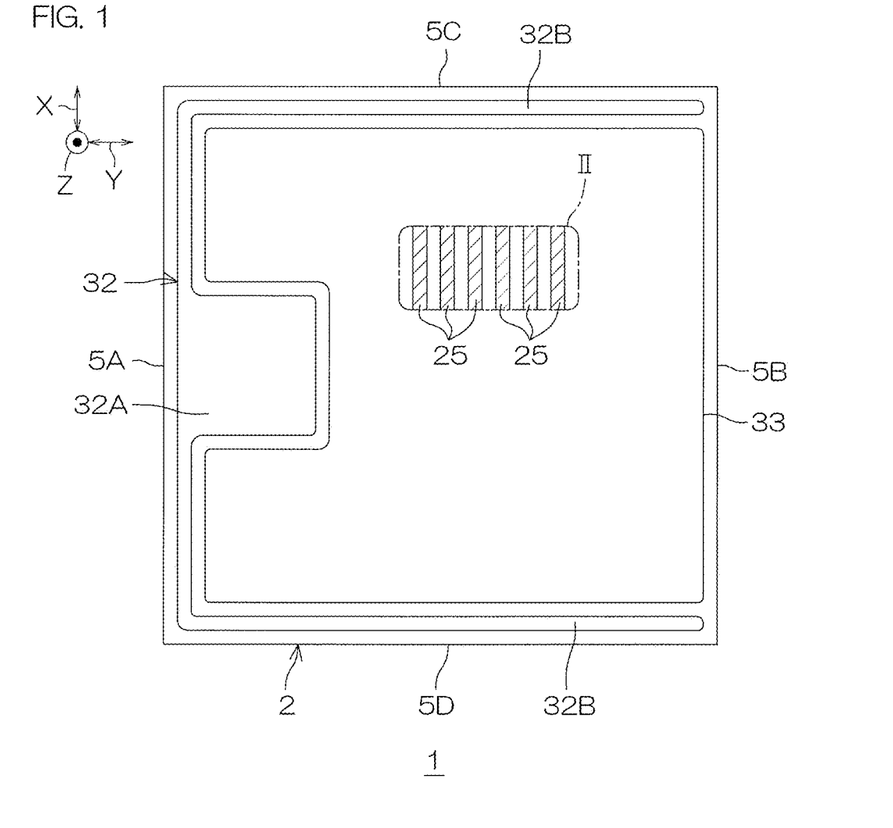
FIG. 1 is a plan view showing a semiconductor device according to one embodiment of the present invention.
Figure 2:
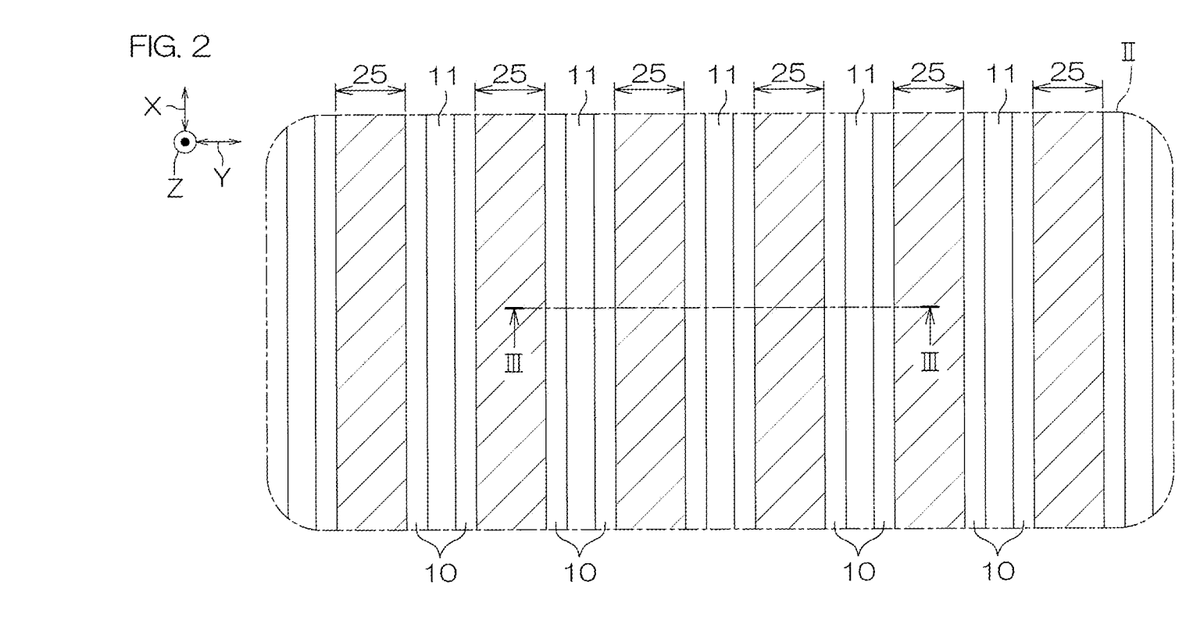
FIG. 2 is an enlarged view of a region II shown in FIG. 1.
Figure 3:
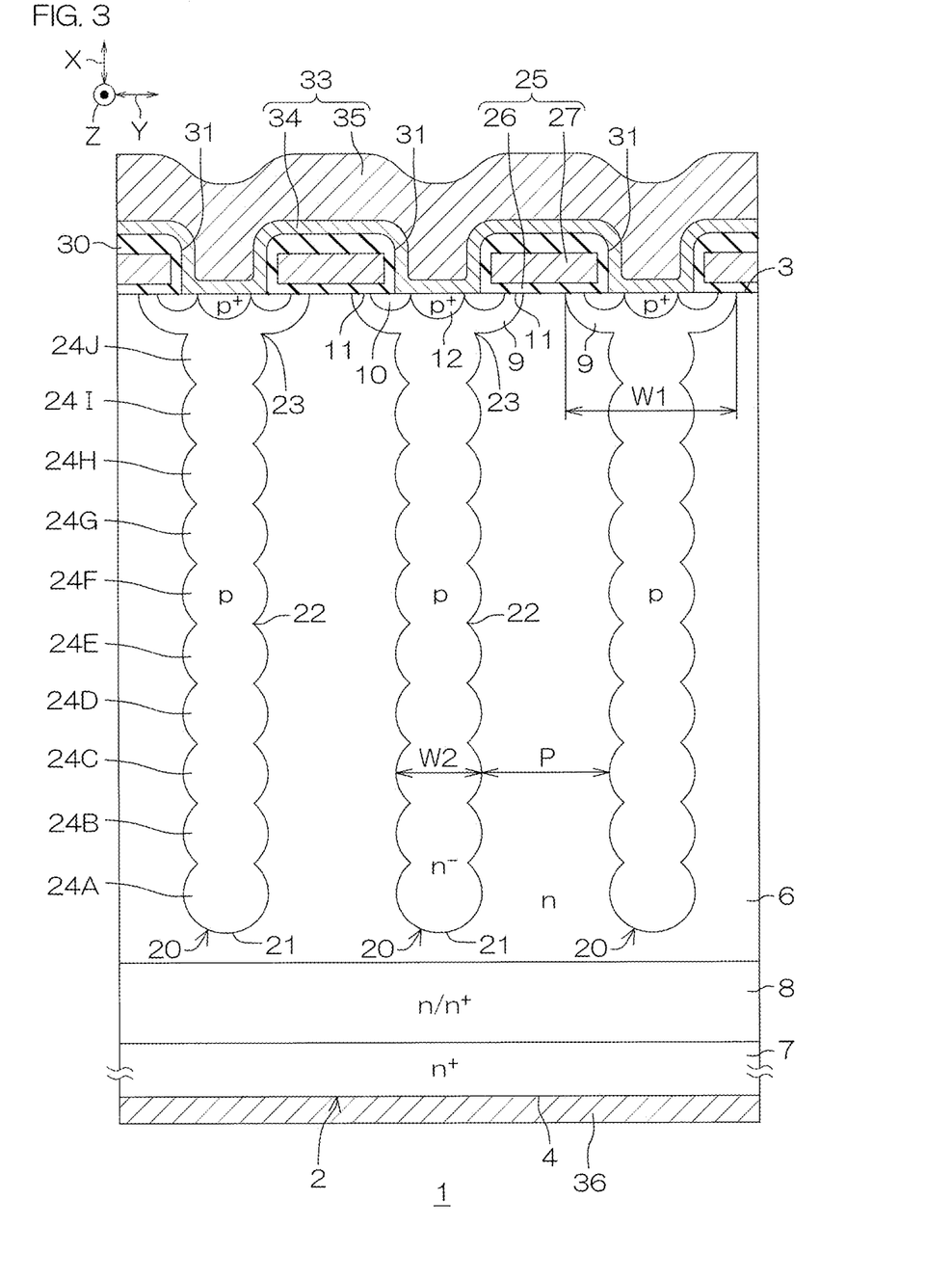
FIG. 3 is a cross-sectional view taken along line III-III shown in FIG. 2.

FIG. 1 is a plan view showing a semiconductor device 1 according to one embodiment of the present invention. FIG. 2 is an enlarged view of a region II shown in FIG. 1. FIG. 3 is a cross-sectional view taken along line III-III shown in FIG. 2.

With reference to FIGS. 1 to 3, the semiconductor device 1 is a semiconductor switching device including a MISFET (Metal Insulator Semiconductor Field Effect Transistor) serving as an example of an insulated gate type transistor. The semiconductor device 1 includes a semiconductor chip 2 formed in a rectangular parallelepiped. The semiconductor chip 2 is made of an Si (silicon) chip in this embodiment.

The semiconductor chip 2 includes a first main surface 3 on one side, a second main surface 4 on the other side, and first to fourth side surfaces 5A to 5D connecting the first main surface 3 and the second main surface 4. The first main surface 3 and the second main surface 4 are formed in a square shape in a plan view seen from the normal direction Z of the main surfaces (hereinafter, simply referred to as "in a plan view"). The first side surface 5A and the second side surface 5B extend in the first direction X and oppose the second direction Y which is orthogonal to the first direction X. The third side surface 5C and the fourth side surface 5D extend in the second direction Y and oppose the first direction X.

The semiconductor chip 2 includes an n-type (first conductivity type) drift region 6 formed in a surface layer portion of the first main surface 3. The drift region 6 is exposed from the first main surface 3 and parts of the first to fourth side surfaces 5A to 5D. An n-type impurity concentration of the drift region 6 may be not less than $1\times10^{15}$ cm$^{-3}$ and not more than $1\times10^{17}$ cm$^{-3}$. In this embodiment, the drift region 6 is formed by an n-type epitaxial layer (Si epitaxial layer).

The drift region 6 may have a thickness of not less than 20 μm and not more than 100 μm. The thickness of the drift region 6 may be not less than 20 μm and not more than 40 μm, not less than 40 μm and not more than 60 μm, not less than 60 μm and not more than 80 μm, or not less than 80 μm and not more than 100 μm. The thickness of the drift region 6 is preferably not less than 45 μm and not more than 65 μm.

The semiconductor device 1 includes a drain region 7 formed in a region on the second main surface 4 side with respect to the drift region 6. The drain region 7 is exposed from the second main surface 4 and parts of the first to fourth side surfaces 5A to 5D, and electrically connected to the drift region 6. The drain region 7 has an n-type impurity concentration exceeding the n-type impurity concentration of the drift region 6. The n-type impurity concentration of the drain region 7 may be substantially fixed. The n-type impurity concentration of the drain region 7 may be not less than $1\times10^{18}$ cm$^{-3}$ and not more than $1\times10^{21}$ cm$^{-3}$. In this embodiment, the drain region 7 is formed by an n-type semiconductor substrate (Si substrate).

A thickness of the drain region 7 may be not less than 10 μm and not more than 450 μm. The thickness of the drain region 7 may be not less than 10 μm and not more than 150 μm, not less than 150 μm and not more than 250 μm, not less than 250 μm and not more than 350 μm, or not less than 350 μm and not more than 450 μm. The thickness of the drain region 7 is preferably not less than 50 μm and not more than 150 μm.

The semiconductor chip 2 further includes an n-type buffer region 8 interposed between the drift region 6 and the drain region 7. The buffer region 8 is exposed from parts of the first to fourth side surfaces 5A to 5D. The buffer region 8 is a concentration transition region between the drift region 6 and the drain region 7, and has an n-type impurity concentration which is gradually increased from the drift region 6 toward the drain region 7. In this embodiment, the buffer region 8 is formed by an n-type epitaxial layer (Si epitaxial layer).

The buffer region 8 has a thickness less than the thickness of the drift region 6. The thickness of the buffer region 8 may be not less than 1 μm and not more than 10 μm. The thickness of the buffer region 8 may be not less than 1 μm and not more than 2.5 μm, not less than 2.5 μm and not more than 5 μm, not less than 5 μm and not more than 7.5 μm, or not less than 7.5 μm and not more than 10 μm.

The semiconductor device 1 includes a plurality of p-type (second conductivity type) base regions 9 formed in a surface layer portion of the drift region 6 on the first main surface 3. A p-type impurity concentration (peak concentration) of the base regions 9 may be not less than $1\times10^{16}$ cm$^{-3}$ and not more than $1\times10^{18}$ cm$^{-3}$. The plurality of base regions 9 are exposed from the first main surface 3. The plurality of base regions 9 are respectively formed in a band shape extending in the first direction X in a plan view, and formed to be spaced from each other in the second direction Y. Thereby, the plurality of base regions 9 are formed in a stripe shape extending in the first direction X in a plan view as a whole. The plurality of base regions 9 are formed to be spaced from a bottom portion of the drift region 6 on the first main surface 3 side.

Each of the plurality of base regions 9 has a first width W1 (base width) in a plan view. The first width W1 is a width in the direction (second direction Y) orthogonal to the direction (first direction X) in which the base regions 9 extend in a plan view. The first width W1 may be not less than 1 μm and not more than 10 μm. The first width W1 is preferably not less than 2 μm and not more than 5 μm.

The semiconductor device 1 includes a plurality of n-type source regions 10 respectively formed in surface layer portions of the plurality of base regions 9. In this embodiment, two source regions 10 are formed in the surface layer portion of each of the plurality of base regions 9. The plurality of source regions 10 are exposed from the first main surface 3. Each of the plurality of source regions 10 has an n-type impurity concentration exceeding the n-type impurity concentration of the drift region 6. The n-type impurity concentration (peak concentration) of the plurality of source regions 10 may be not less than $1\times10^{18}$ cm$^{-3}$ and not more than $1\times10^{21}$ cm$^{-3}$.

The plurality of source regions 10 are respectively formed in a band shape extending in the first direction X in the surface layer portions of the plurality of base regions 9 in a plan view, and formed to be spaced from each other in the second direction Y. Each two of the plurality of source regions 10 are formed to be spaced from a bottom portion of the base region 9 on the first main surface 3 side. Each two of the plurality of source regions 10 are formed to be spaced from an edge portion of the base region 9 in the corresponding base region 9. Thereby, the plurality of source regions 10 demarcate a channel region 11 with the drift region 6 in the surface layer portion of the corresponding base region 9.

The semiconductor device 1 includes a plurality of p-type contact regions 12 respectively formed in regions different from the plurality of source regions 10 in the surface layer portions of the plurality of base regions 9. In this embodiment, a single contact region 12 is formed in a region between the two source regions 10 in the surface layer portion of each of the plurality of base regions 9. Each of the plurality of contact regions 12 has a p-type impurity concentration exceeding the p-type impurity concentration of the base regions 9. The p-type impurity concentration (peak concentration) of the plurality of contact regions 12 may be not less than $1\times10^{18}$ cm$^{-3}$ and not more than $1\times10^{21}$ cm$^{-3}$.

The plurality of contact regions 12 are respectively formed in a band shape extending in the first direction X in a plan view. The plurality of contact regions 12 are formed to be spaced from the bottom portions of the base regions 9 on the first main surface 3 side. The number of the contact regions 12 in each of the base regions 9 is arbitrary, and the plurality of contact regions 12 may be formed in the surface layer portion of each of the base regions 9 to be spaced from each other.

The semiconductor device 1 includes a plurality of p-type column regions 20 formed in the drift region 6. Each of the plurality of column regions 20 forms a pn junction portion between the drift region 6 and the column region 20. Thereby, the plurality of column regions 20 define a super junction structure (hereinafter, simply referred to as the "SJ structure") between the drift region 6 and the column regions 20.

The plurality of column regions 20 are respectively formed in a column shape extending in a thickness direction of the drift region 6 (normal direction Z) in regions immediately below the plurality of base regions 9. The plurality of column regions 20 respectively oppose the plurality of base regions 9 in one-to-one correspondence with each other in the thickness direction of the drift region 6. The plurality of column regions 20 are respectively formed in a band shape extending in the first direction X in a plan view, and formed to be spaced from each other in the second direction Y. Thereby, the plurality of base regions 9 are formed in a stripe shape extending in the first direction X in a plan view as a whole.

The plurality of column regions 20 may be formed at a pitch P of not less than 1 µm and not more than 15 µm in a plan view. The pitch P is preferably not less than 3 µm and not more than 10 µm. Each of the plurality of column regions 20 may have a thickness of not less than 10 µm and not more than 100 µm in the thickness direction (normal direction Z).

Each of the plurality of column regions 20 preferably has a thickness of not less than 20 µm and not more than 80 µm. Each of the plurality of column regions 20 preferably has a thickness less than the thickness of the drift region 6.

Each of the plurality of column regions 20 has a second width W2 (column width) which is less than the first width W1 of the base region 9 in a plan view. The second width W2 is a width in the direction (second direction Y) orthogonal to the direction (first direction X) in which the column regions 20 extend in a plan view (width of the widest portion). The second width W2 may be not less than 1 µm and not more than 8 µm. The first width W1 is preferably not less than 1 µm and not more than 5 µm.

Each of the plurality of column regions 20 has a lower end portion 21, an intermediate portion 22 and an upper end portion 23 in the normal direction Z. The lower end portion 21 of the column region 20 is formed to be spaced from the bottom portion of the drift region 6 on the first main surface 3 side (upper end portion 23 side). The lower end portion 21 opposes the drain region 7 (buffer region 8) across a part of the drift region 6. The upper end portion 23 of the column region 20 is connected to the base region 9. The column region 20 opposes the contact region 12 across a part of the base region 9.

Each of the plurality of column regions 20 has a laminated structure including a plurality of (ten in this embodiment) impurity regions 24 laminated in a column shape in the thickness direction of the drift region 6 (normal direction Z). Hereinafter, the ten impurity regions 24 will be referred to as the first to tenth impurity regions 24A to 24J. The first to tenth impurity regions 24A to 24J are laminated in this order from the drift region 6 side toward the base region 9 side. The plurality of first to tenth impurity regions 24A to 24J are laminated to be connected to each other, and form a single column region 20 as a whole.

Each of the lower end portions 21 of the plurality of column regions 20 is formed by the lowermost first impurity region 24A. Each of the upper end portions 23 of the plurality of column regions 20 is formed by the uppermost tenth impurity region 24J. Each of the intermediate portions 22 of the plurality of column regions 20 is formed by one or two impurity regions 24 (fifth to sixth impurity regions 24E to 24F in this embodiment) positioned between the lowermost first impurity region 24A and the uppermost tenth impurity region 24J.

The p-type impurity concentrations (peak concentrations) of the plurality of first to tenth impurity regions 24A to 24J may be not less than $1\times10^{15}$ cm$^{-3}$ and not more than $1\times10^{18}$ cm$^{-3}$. That is, each of the plurality of column regions 20 has a plurality of peak concentrations by the plurality of first to tenth impurity regions 24A to 24J in the thickness direction. Each of the first to tenth impurity regions 24A to 24J preferably has a thickness of not less than 2 µm and not more than 10 µm in the thickness direction (normal direction Z).

The number of the impurity regions 24 is adjusted in accordance with the thickness of the column region 20. The number of the impurity regions 24 is arbitrary but preferably not less than 5 and not more than 20. The plurality of impurity regions 24 may be formed by a multi-epitaxial growth method of alternately performing a p-type impurity introduction process and an epitaxial growth process.

The semiconductor device 1 includes a plurality of planar gate structures 25 (gate structures) formed on the first main surface 3. The plurality of planar gate structures 25 are respectively formed in a band shape extending in the first direction X, and formed to be spaced from each other in the second direction Y. Thereby, the plurality of planar gate structures 25 are formed in a stripe shape extending in the first direction X in a plan view as a whole.

Each of the plurality of planar gate structures 25 bridges peripheral edge portions of the two adjacent base regions 9 to cover the channel regions 11 on the first main surface 3. The plurality of planar gate structures 25 are formed to be spaced from the plurality of column regions 20 in a plan view. The plurality of planar gate structures 25 preferably do not overlap the plurality of column regions 20 in a plan view.

Each of the plurality of planar gate structures 25 has a laminated structure including a gate insulation film 26 and a gate electrode 27. The gate insulation film 26 bridges the peripheral edge portions of the two adjacent base regions 9, and covers the drift region 6, the channel regions 11, and the source regions 10. The gate insulation film 26 may contain at least one of silicon oxide, silicon nitride, and aluminum oxide. In this embodiment, the gate insulation film 26 has a single layer structure including a silicon oxide film.

Each of the gate electrodes 27 is formed on the gate insulation film 26 to bridge the peripheral edge portions of the two adjacent base regions 9, and opposes the drift region 6, the channel regions 11, and the source regions 10 across the gate insulation film 26. The gate electrode 27 may contain at least one of conductive polysilicon, tungsten, aluminum, copper, aluminum alloy, and copper alloy. In this embodiment, the gate electrode 27 contains conductive polysilicon. Conductive polysilicon may be n-type polysilicon or p-type polysilicon.

The semiconductor device 1 includes an interlayer insulation film 30 that covers the plurality of planar gate structures 25 on the first main surface 3. The interlayer insulation film 30 may contain silicon oxide. The interlayer insulation film 30 has a plurality of contact holes 31. The plurality of contact holes 31 include a plurality of source contact holes from which the source regions 10 and the contact regions 12 are exposed. The plurality of contact holes 31 include a plurality of gate contact holes from which the gate electrodes 27 of the plurality of planar gate structures 25 are exposed in a region not shown in the figures.

With reference to FIGS. 1 and 3, the semiconductor device 1 includes a gate terminal 32 and a source terminal 33 formed on the interlayer insulation film 30. In this embodiment, the gate terminal 32 includes a main body portion 32A and finger portions 32B. The main body portion 32A is arranged on the central portion side of the first side surface 5A on the interlayer insulation film 30. The main body portion 32A may be formed in a square shape in a plan view. The main body portion 32A is arbitrarily arranged, and may be arranged on the side of an arbitrary corner portion of the semiconductor chip 2 in a plan view.

The finger portions 32B are pulled out in a band shape from the gate terminal 32 toward arbitrary regions. In this embodiment, the finger portions 32B extend in a band shape from the gate terminal 32 along the first side surface 5A, the third side surface 5C, and the fourth side surface 5D in a plan view, and partition an inner region of the semiconductor chip 2 from the three directions. The finger portions 32B enter the plurality of contact holes 31 from the upper side of the interlayer insulation film 30, and are electrically connected to the plurality of gate electrodes 27.

The source terminal 33 is arranged in the region partitioned by the gate terminal 32 and spaced from the gate terminal 32 on the interlayer insulation film 30. The source terminal 33 enters the plurality of contact holes 31 from the upper side of the interlayer insulation film 30, and is electrically connected to the plurality of source regions 10 and the plurality of contact regions 12.

Each of the gate terminal 32 and the source terminal 33 may have a laminated structure including a barrier electrode film 34 and a main electrode film 35 laminated in this order from the semiconductor chip 2 side. The barrier electrode film 34 may contain at least one of a Ti film and a TiN film. The main electrode film 35 may contain at least one of a pure Al film, a pure Cu film, an AlSi alloy film, an AlCu alloy film, and an AlSiCu alloy film. A plating film may be respectively formed on outer surfaces of the gate terminal 32 and the source terminal 33. The plating film may contain at least one of an Ni film, a Pd film, and an Au film.

The semiconductor device 1 includes a drain terminal 36 formed on the second main surface 4. The drain terminal 36 is electrically connected to the drain region 7. The drain terminal 36 may contain at least one of a Ti film, an Ni film, an Au film, an Ag film, and an Al film.

Figure 4:
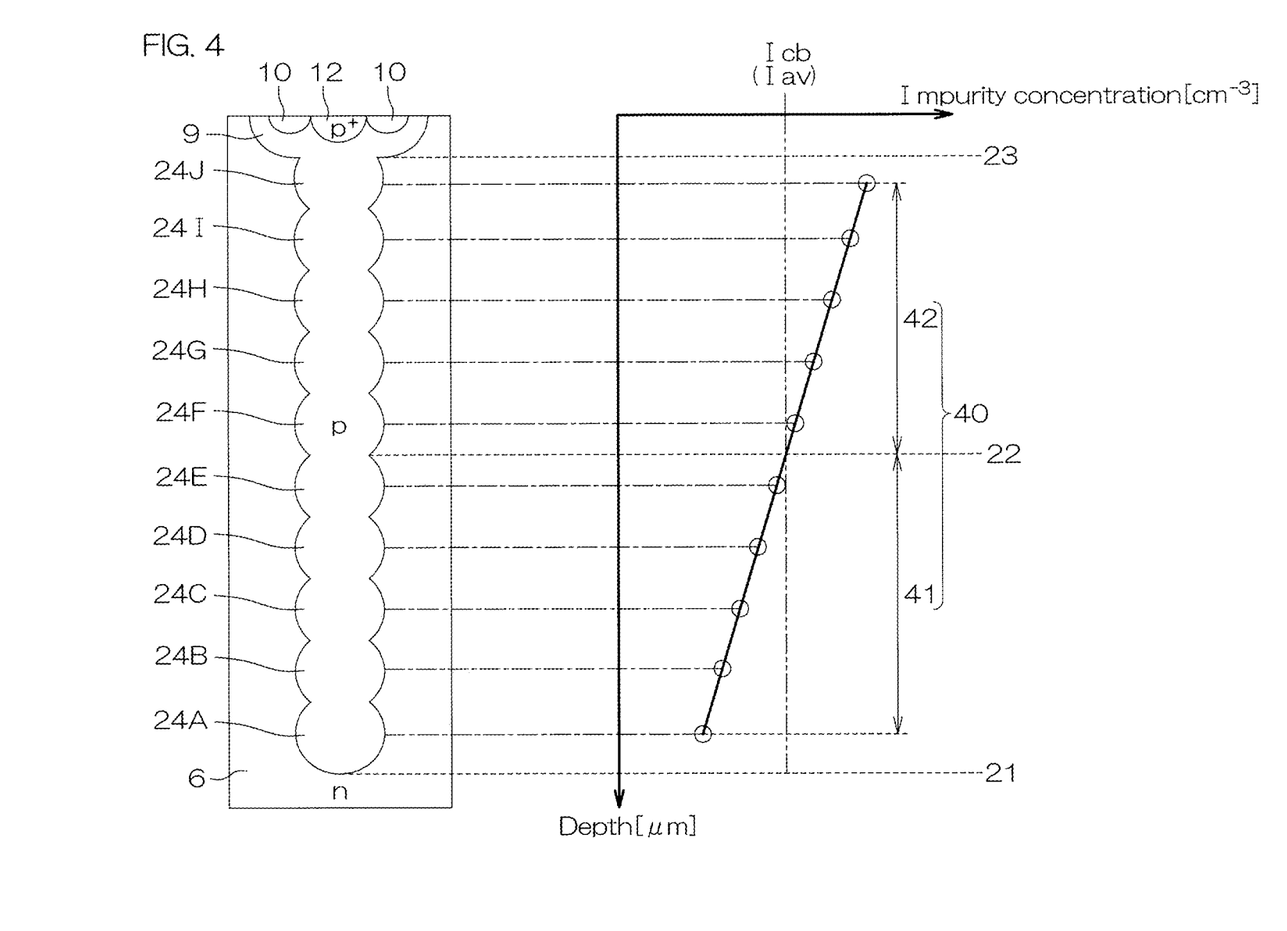
FIG. 4 is a diagram for describing an impurity concentration of a column region according to a first configuration example.

Next, with reference to FIG. 4, the p-type impurity concentrations of the plurality of column regions 20 will be specifically described. Since the plurality of column regions 20 have the same structure, an example of the structure of the single column region 20 will be described below. In FIG. 4, a region including the single column region 20 is shown on the left side of a paper plane, and a concentration gradient of the p-type impurity concentrations of the column region 20 is shown on the right side of the paper plane. Specifically, the concentration gradient of the column region 20 is formed by the peak concentrations of the plurality of first to tenth impurity regions 24A to 24J.

FIG. 4 shows a charge balance concentration Icb of a fixed value by a double chain line. The charge balance concentration Icb is a concentration with which a charge balance is achieved between the column region 20 and the drift region 6 in an ideal mode. The charge balance is a balance between an n-type charge amount (n-type impurity concentration) of the drift region 6 and a p-type charge amount (p-type impurity concentration) of the column region 20. A state where the charge balance is achieved indicates a state where the n-type charge amount of the drift region 6 and the p-type charge amount of the column region 20 are balanced. In a case where the column region 20 is formed with the charge balance concentration Icb, a withstand voltage of the semiconductor device 1 (specifically, a breakdown voltage BVDSS) becomes a theoretical maximum value.

With reference to FIG. 4, the column region 20 includes a compensation region 40 formed between the lower end portion 21 and the upper end portion 23. The compensation region 40 specifically includes a low concentration portion 41 on the lower end portion 21 side, and a high concentration portion 42 on the upper end portion 23 side. The low concentration portion 41 is a region having a relatively low p-type impurity concentration between the lower end portion 21 and the intermediate portion 22. The high concentration portion 42 is a region having a relatively high p-type impurity concentration between the intermediate portion 22 and the upper end portion 23. The high concentration portion 42 has a p-type impurity concentration exceeding the p-type impurity concentration of the low concentration portion 41. In the compensation region 40, the charge balance is compensated within a p-type impurity concentration range between the low concentration portion 41 and the high concentration portion 42.

In this embodiment, the low concentration portion 41 has a p-type impurity concentration less than the charge balance concentration Icb. The low concentration portion 41 may have a p-type impurity concentration less than an average concentration Iav of the column region 20. The average concentration Iav is preferably set within a range of ±5% of the charge balance concentration Icb. The average concentration Iav may be equal to the charge balance concentration Icb. The p-type impurity concentration of the low concentration portion 41 may be set within a range of not less than 85% and less than 100% (preferably, not less than 95% and less than 100%) of the charge balance concentration Icb (or the average concentration Iav).

In this embodiment, the low concentration portion 41 is formed over the entire region between the lower end portion 21 and the intermediate portion 22. That is, the low concentration portion 41 is formed by the first to fifth impurity regions 24A to 24E. The peak concentrations of the first to fifth impurity regions 24A to 24E are gradually increased from the lower end portion 21 toward the intermediate portion 22.

Therefore, the low concentration portion 41 has a concentration gradient in which the p-type impurity concentration is increased (specifically, gradually increased) from the lower end portion 21 toward the intermediate portion 22. As long as the condition that a p-type impurity concentration on the intermediate portion 22 side exceeds a p-type impurity concentration on the lower end portion 21 side is provided, at least two among the first to fifth impurity regions 24B to 24E may have equal p-type impurity concentrations (peak concentrations).

In this embodiment, the high concentration portion 42 has a p-type impurity concentration exceeding the charge balance concentration Icb. The high concentration portion 42 may be set as a value exceeding the average concentration Iav. The p-type impurity concentration of the high concentration portion 42 may be set within a range of exceeding 100% and not more than 115% (preferably, a range of exceeding 100% and not more than 105%) of the charge balance concentration Icb (or the average concentration Iav).

In this embodiment, the high concentration portion 42 is formed over the entire region between the intermediate portion 22 and the upper end portion 23. That is, the high concentration portion 42 is formed by the sixth to tenth impurity regions 24F to 24J. The peak concentrations of the sixth to tenth impurity regions 24F to 24J are gradually increased from the intermediate portion 22 toward the upper end portion 23. Therefore, the high concentration portion 42 has a concentration gradient in which the p-type impurity concentration is increased (specifically, gradually increased) from the intermediate portion 22 toward the upper end portion 23.

In this embodiment, the peak concentrations of the sixth to tenth impurity regions 24F to 24J are gradually increased continuously from the first to fifth impurity regions 24A to 24E (that is, the low concentration portion 41). Therefore, the high concentration portion 42 has a concentration gradient in which the p-type impurity concentration is increased continuously from the low concentration portion 41. As long as the condition that a p-type impurity concentration on the upper end portion 23 side exceeds a p-type impurity concentration on the intermediate portion 22 side is provided, at least two among the sixth to tenth impurity regions 24F to 24J may have equal p-type impurity concentrations (peak concentrations).

As mentioned above, in this embodiment, the compensation region 40 has a concentration gradient in which the p-type impurity concentration is increased (specifically, gradually increased) from the lower end portion 21 toward the upper end portion 23. The concentration gradient of the compensation region 40 runs from the low concentration portion 41 to the high concentration portion 42 through the charge balance concentration Icb. That is, in the column region 20 according to a first configuration example, the concentration gradient which deviates from the charge balance concentration Icb is introduced between the lower end portion 21 and the upper end portion 23 by the compensation region 40.

Figure 5:
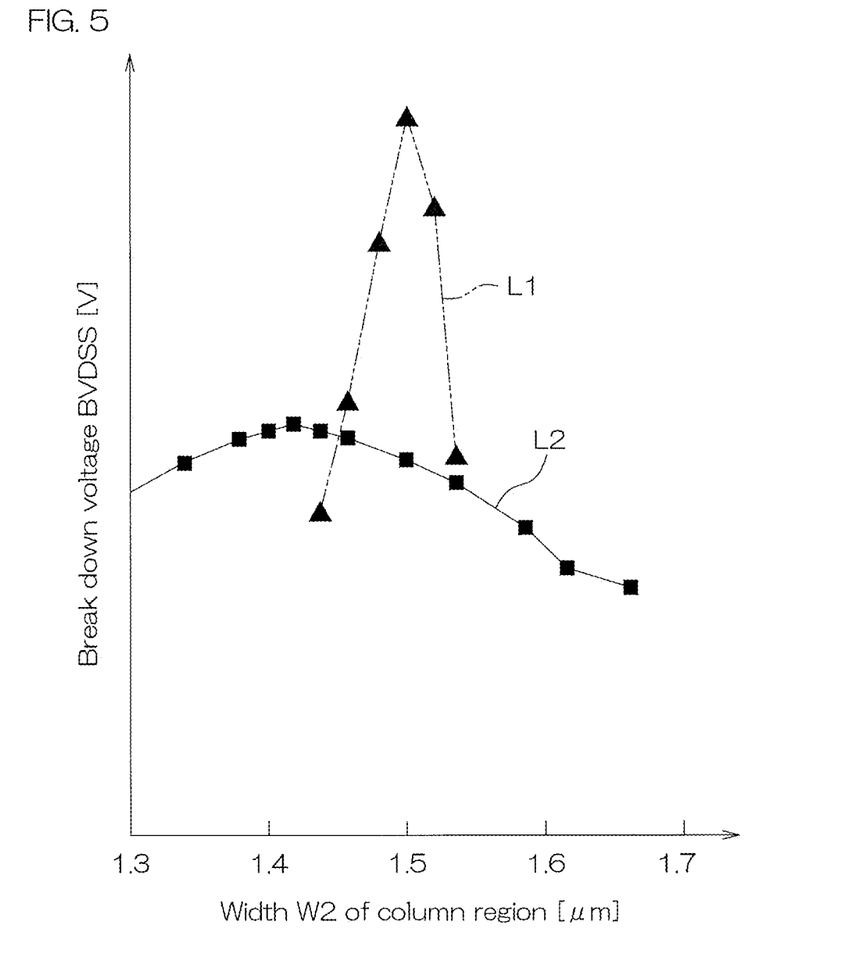
FIG. 5 is a graph for describing a breakdown voltage when the column region shown in FIG. 4 is adopted.

FIG. 5 is a graph for describing a breakdown voltage BVDSS (actual measurement) when the column region 20 shown in FIG. 4 is adopted. In FIG. 5, the vertical axis indicates the breakdown voltage BVDSS [V], and the horizontal axis indicates the second width W2 [μm] of the column region 20. A relationship between the breakdown voltage BVDSS and the second width W2 indicates a process error generated in the column region 20. FIG. 5 shows a first sequential line L1 (double chain line) and a second sequential line L2 (solid line).

The first sequential line L1 shows a result of a case where a column region 20 having a fixed charge balance concentration Icb (hereinafter, simply referred to as the "column region 20 according to the comparative example") is formed. In the column region 20 according to the comparative example, a designed value of the second width W2 with which the breakdown voltage BVDSS is maximized is approximately 1.5 μm. The second sequential line L2 shows a result of a case where the column region 20 having the compensation region 40 (column region 20 according to the first configuration example) is formed. In the column region 20 according to the first configuration example, a designed value of the second width W2 with which the breakdown voltage BVDSS is maximized is approximately 1.42 μm.

With reference to the first sequential line L1, in a case of the column region 20 according to the comparative example and in a case where the second width W2 is formed as the designed value, it is possible to realize a relatively high breakdown voltage BVDSS. However, when the second width W2 deviates from the designed value, the breakdown voltage BVDSS is sharply lowered. From this result, it is found that, with the column region 20 according to the comparative example, it is possible to realize a relatively high breakdown voltage BVDSS whereas a change amount of the breakdown voltage BVDSS with respect to the process error of the second width W2 is extremely large.

Meanwhile, with reference to the second sequential line L2, in a case of the column region 20 according to the first configuration example, an increase amount of the breakdown voltage BVDSS is reduced. However, a sharp lowering of the breakdown voltage BVDSS due to the process error is suppressed. That is, it is found that, with the column region 20 according to the first configuration example, in comparison to the column region 20 according to the comparative example, the breakdown voltage BVDSS is lowered. However, the change amount of the breakdown voltage BVDSS due to the process error becomes sluggish.

With the column region 20 according to the comparative example, in a case where the second width W2 is increased more than the designed value, the p-type charge amount of the column region 20 surpasses the n-type charge amount of the drift region 6. In this case, an electric field is concentrated on the lower end portion 21 of the column region 20, and the breakdown voltage BVDSS is lowered. Meanwhile, in a case where the second width W2 is decreased less than the designed value, the n-type charge amount of the drift region 6 surpasses the p-type charge amount of the column region 20. In this case, an electric field is concentrated on the upper end portion 23 of the column region 20, and the breakdown voltage BVDSS is lowered.

Meanwhile, the column region 20 according to the first configuration example includes the compensation region 40 having the concentration gradient which deviates from the charge balance concentration Icb in a region between the lower end portion 21 and the upper end portion 23. The compensation region 40 specifically includes the low concentration portion 41 on the lower end portion 21 side and the high concentration portion 42 on the upper end portion 23 side, and the charge balance is compensated within the p-type impurity concentration range between the low concentration portion 41 and the high concentration portion 42.

In a case of the column region 20 according to the first configuration example, the charge balance is not achieved over the entire region in the thickness direction. Thus, when compared to the column region 20 according to the comparative example, the breakdown voltage BVDSS is lowered. However, the low concentration portion 41 of the compensation region 40 is formed in the region between the lower end portion 21 and the intermediate portion 22 where an electric field easily is concentrated, and has a relatively low p-type impurity concentration. Meanwhile, the high concentration portion 42 of the compensation region 40 is formed in the region between the intermediate portion 22 and the lower end portion 21 where an electric field easily is concentrated, and has a relatively high p-type impurity concentration.

Therefore, even when the second width W2 is increased more than the designed value due to the process error, it is possible to ease an electric field concentration on the lower end portion 21 by the low concentration portion 41. Even when the second width W2 is decreased less than the designed value due to the process error, it is possible to ease an electric field concentration on the upper end portion 23 by the high concentration portion 42. As a result, it is possible to suppress fluctuations in breakdown voltage BVDSS due to the process error of the second width W2. Therefore, it is possible to stably manufacture the semiconductor device 1 having the breakdown voltage BVDSS of not less than a fixed value.

Figure 6:
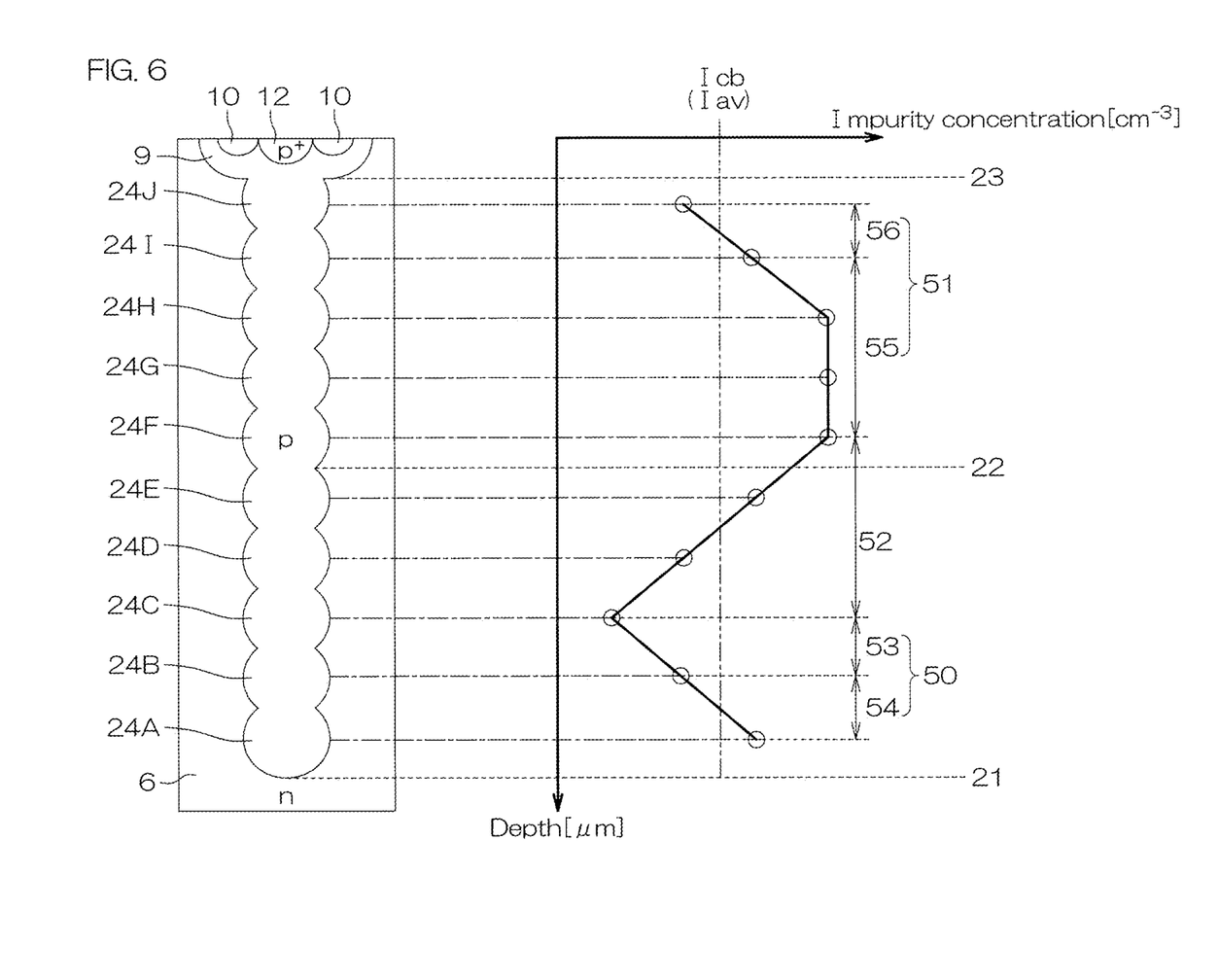
FIG. 6 is a diagram for describing an impurity concentration of a column region according to a second configuration example.

FIG. 6 is a diagram for describing a p-type impurity concentration of a column region 20 according to a second configuration example. In FIG. 6, a region including the single column region 20 is shown on the left side of the paper plane, and a gradient of p-type impurity concentrations of the column region 20 is shown on the right side of the paper plane. The concentration gradient of the column region 20 is specifically formed by peak concentrations of a plurality of first to tenth impurity regions 24A to 24J. In FIG. 6, a charge balance concentration Icb is shown by a double chain line.

The column region 20 includes a lower compensation region 50 on the lower end portion 21 side and an upper compensation region 51 on the upper end portion 23 side. The column region 20 further includes a compensation region 52 formed between the lower compensation region 50 and the upper compensation region 51. Hereinafter, the lower compensation region 50, the upper compensation region 51, and the compensation region 52 will be described in order.

The lower compensation region 50 is formed in a region between the lower end portion 21 and the intermediate portion 22. The lower compensation region 50 is specifically formed in a region on the lower end portion 21 side to be spaced from the intermediate portion 22 on the lower end portion 21 side. In this embodiment, the lower compensation region 50 is formed by the first to third impurity regions 24A to 24C.

The lower compensation region 50 includes a low concentration portion 53 formed between the lower end portion 21 and the intermediate portion 22, and a lower high concentration portion 54 formed between the low concentration portion 53 and the lower end portion 21. The lower high concentration portion 54 is a region having a p-type impurity concentration which exceeds a p-type impurity concentration of the low concentration portion 53 on the lower end portion 21 side of the low concentration portion 53. That is, the lower compensation region 50 is configured as a concentration increasing region formed in a region of the column region 20 on the lower end portion 21 side. In the lower compensation region 50, a charge balance is compensated within an impurity concentration range between the low concentration portion 53 and the lower high concentration portion 54.

The low concentration portion 53 is formed to be spaced from at least the lower end portion 21 on the intermediate portion 22 side. In this embodiment, the low concentration portion 53 is formed to be spaced from the intermediate portion 22 on the lower end portion 21 side. The low concentration portion 53 may overlap the intermediate portion 22. In this embodiment, the low concentration portion 53 has a p-type impurity concentration (peak concentration) of the second to third impurity regions 24B to 24C.

In this embodiment, the p-type impurity concentration (peak concentration) of the second to third impurity regions 24B to 24C is less than the charge balance concentration Icb. Therefore, in this embodiment, the low concentration portion 53 has a p-type impurity concentration less than the charge balance concentration Icb. The low concentration portion 53 may be set as a value less than an average concentration Iav of the column region 20. The average concentration Iav is preferably set within a range of ±5% of the charge balance concentration Icb. The average concentration Iav may be equal to the charge balance concentration Icb.

The p-type impurity concentration of the low concentration portion 53 may be set, for example, within a range of not less than 85% and less than 100% (preferably, a range of not less than 95% and less than 100%) of the charge balance concentration Icb (or the average concentration Iav). The low concentration portion 53 preferably has a p-type impurity concentration which is a minimum value in the concentration gradient of the column region 20. With this structure, it is possible to properly suppress an electric field concentration on the lower end portion 21.

The lower high concentration portion 54 is formed in the lowermost end of the column region 20. In this embodiment, the lower high concentration portion 54 has a p-type impurity concentration (peak concentration) of the first to second impurity regions 24A to 24B. In this embodiment, the p-type impurity concentration (peak concentration) of the first impurity region 24A exceeds the charge balance concentration Icb. Therefore, in this embodiment, the lower high concentration portion 54 has a p-type impurity concentration exceeding the charge balance concentration Icb. The lower high concentration portion 54 may be set as a value exceeding the average concentration Iav.

The p-type impurity concentration of the lower high concentration portion 54 may be set within a range of exceeding 100% and not more than 115% (preferably, a range of exceeding 100% and not more than 105%) of the charge balance concentration Icb (or the average concentration Iav). The lower high concentration portion 54 preferably has a p-type impurity concentration less than a maximum value in the concentration gradient of the column region 20. With this structure, it is possible to properly suppress the electric field concentration on the lower end portion 21.

In this embodiment, the second impurity region 24B has the p-type impurity concentration (peak concentration) between the p-type impurity concentration (peak concentration) of the first impurity region 24A and the p-type impurity concentration (peak concentration) of the third impurity region 24C. Thereby, the lower compensation region 50 has a concentration gradient in which the p-type impurity concentration is increased (specifically, gradually increased) from the low concentration portion 53 toward the lower high concentration portion 54. The lower compensation region 50 also has a concentration gradient running from the low concentration portion 53 to the lower high concentration portion 54 through the charge balance concentration Icb.

Although being different depending on the number of the impurity regions 24 arranging the column region 20, the number of the impurity regions 24 arranging the lower compensation region 50 is preferably not less than two and not more than five. In a case where the lower compensation region 50 includes three or more impurity regions 24, as long as the condition that the p-type impurity concentration of the lower high concentration portion 54 exceeds the p-type impurity concentration of the low concentration portion 53 is provided, at least two among the three or more impurity regions 24 may have equal p-type impurity concentrations (peak concentrations). For example, the second impurity region 24B may have a p-type impurity concentration equal to the p-type impurity concentration of any one of the first impurity region 24A and the third impurity region 24C.

The upper compensation region 51 is formed in a region between the intermediate portion 22 and the upper end portion 23. The upper compensation region 51 is specifically formed in a region on the upper end portion 23 side to be spaced from the intermediate portion 22 on the upper end portion 23 side. In this embodiment, the upper compensation region 51 is formed by the sixth to tenth impurity regions 24F to 24J.

The upper compensation region 51 specifically includes a high concentration portion 55 formed between the intermediate portion 22 and the upper end portion 23, and an upper low concentration portion 56 formed between the high concentration portion 55 and the upper end portion 23. The upper low concentration portion 56 is a region having a p-type impurity concentration which is less than a p-type impurity concentration of the high concentration portion 55 on the upper end portion 23 side of the high concentration portion 55. That is, the upper compensation region 51 is configured as a concentration decreasing region formed in a region of the column region 20 on the upper end portion 23 side. In the upper compensation region 51, the charge balance is compensated within an impurity concentration range between the high concentration portion 55 and the upper low concentration portion 56.

The high concentration portion 55 is formed to be spaced from at least the upper end portion 23 on the intermediate portion 22 side. The high concentration portion 55 may be formed to be spaced from the intermediate portion 22 on the upper end portion 23 side. In a case where the low concentration portion 53 is formed to be spaced from the intermediate portion 22 on the lower end portion 21, the high concentration portion 55 may overlap the intermediate portion 22. In this embodiment, the high concentration portion 55 has a p-type impurity concentration (peak concentration) of the sixth to ninth impurity regions 24F to 24I.

In this embodiment, the high concentration portion 55 has a p-type impurity concentration exceeding the charge balance concentration Icb. The high concentration portion 55 may be set as a value exceeding the average concentration Iav. The p-type impurity concentration of the high concentration portion 55 may be set, for example, within a range of exceeding 100% and not more than 115% (preferably, a range of exceeding 100% and not more than 105%) of the charge balance concentration Icb (or the average concentration Iav).

The high concentration portion 55 preferably has a p-type impurity concentration which is a maximum value in the concentration gradient of the column region 20. That is, the high concentration portion 55 preferably has a p-type impurity concentration exceeding the p-type impurity concentration of the lower high concentration portion 54. With this structure, it is possible to properly suppress an electric field concentration on the upper end portion 23. The high concentration portion 55 includes the plurality of (three in this embodiment) sixth to eighth impurity regions 24F to 24H in which the p-type impurity concentration (peak concentration) is set as a maximum value. In the high concentration portion 55, the number of the impurity regions 24 set to be maximum values is arbitrary and may be one or more.

The upper low concentration portion 56 is formed in the uppermost end of the column region 20. In this embodiment, the upper low concentration portion 56 has a p-type impurity concentration (peak concentration) of the ninth to tenth impurity regions 24I to 24J. In this embodiment, the tenth impurity region 24J has a p-type impurity concentration less than the charge balance concentration Icb. Therefore, in this embodiment, the upper low concentration portion 56 has a p-type impurity concentration less than the charge balance concentration Icb. The upper low concentration portion 56 may be set as a value less than the average concentration Iav.

The p-type impurity concentration of the upper low concentration portion 56 may be set, for example, within a range of not less than 85% and less than 100% (preferably, a range of not less than 95% and less than 100%) of the charge balance concentration Icb (or the average concentration Iav). The upper low concentration portion 56 preferably has a p-type impurity concentration which exceeds the minimum value and is less than the maximum value in the concentration gradient of the column region 20. That is, the upper low concentration portion 56 preferably has a p-type impurity concentration which exceeds the p-type impurity concentration of the low concentration portion 53 and is less than the p-type impurity concentration of the high concentration portion 55. With this structure, it is possible to properly suppress the electric field concentration on the upper end portion 23.

Since the upper end portion 23 of the column region 20 is an inflow path of an electric current, a current density (that is, an electric field) is particularly easily increased. Therefore, the upper low concentration portion 56 preferably has a thickness less than a thickness of the high concentration portion 55. That is, a ratio of the upper low concentration portion 56 in the upper compensation region 51 is preferably less than a ratio of the high concentration portion 55 in the upper compensation region 51. With this structure, the p-type impurity concentration decreased following introduction of the upper low concentration portion 56 is supplemented by the high concentration portion 55. Thereby, it is possible to properly ease the electric field concentration on the upper end portion 23.

In this embodiment, the ninth impurity region 24I has the p-type impurity concentration (peak concentration) between the p-type impurity concentration (peak concentration) of the eighth impurity region 24I and the p-type impurity concentration (peak concentration) of the tenth impurity region 24J. Thereby, the upper compensation region 51 has a concentration gradient in which the p-type impurity concentration is decreased (specifically, gradually decreased) from the high concentration portion 55 toward the upper low concentration portion 56.

The upper compensation region 51 also has a concentration gradient running from the high concentration portion 55 to the upper low concentration portion 56 through the charge balance concentration Icb. That is, the upper compensation region 51 has a p-type impurity concentration range (concentration gradient) overlapping the p-type impurity concentration range (concentration gradient) of the lower compensation region 50 on the upper end portion 23 side.

Although being different depending on the number of the impurity regions 24 arranging the column region 20, the number of the impurity regions 24 arranging the upper compensation region 51 is preferably not less than two and not more than five. In a case where the upper compensation region 51 includes three or more impurity regions 24, as long as the condition that the p-type impurity concentration of the upper low concentration portion 56 is less than the p-type impurity concentration of the high concentration portion 55 is provided, at least two among the three or more impurity regions 24 may have equal p-type impurity concentrations (peak concentrations). For example, the ninth impurity region 24I may have a p-type impurity concentration equal to the p-type impurity concentration of any one of the eighth impurity region 24H and the tenth impurity region 24J.

The compensation region 52 includes the low concentration portion 53 and the high concentration portion 55. That is, the compensation region 52 is configured as a concentration increasing region formed in an intermediate region of the column region 20. In the compensation region 52, the charge balance is compensated between the low concentration portion 53 (lower compensation region 50) and the high concentration portion 55 (upper compensation region 51).

In this embodiment, the compensation region 52 has a p-type impurity concentration (peak concentration) of the third to sixth impurity regions 24C to 24F. In this embodiment, the sixth to eighth impurity regions 24F to 24H have equal impurity concentrations. Thus, the compensation region 52 may include the seventh to eighth impurity regions 24G to 24H. The p-type impurity concentrations (peak concentrations) of the fourth to fifth impurity regions 24D to 24E are increased (specifically, gradually increased) from the low concentration portion 53 toward the high concentration portion 55. Thereby, the compensation region 52 is formed such that the p-type impurity concentration is increased (specifically, gradually increased) from the low concentration portion 53 toward the high concentration portion 55.

The compensation region 52 has a concentration gradient running from the low concentration portion 53 to the high concentration portion 55 through the charge balance concentration Icb. That is, the compensation region 52 has a p-type impurity concentration range (concentration gradient) overlapping the p-type impurity concentration range (concentration gradient) of the lower compensation region 50 and the p-type impurity concentration range (concentration gradient) of the upper compensation region 51.

Although being different depending on the number of the impurity regions 24, the number of the impurity regions 24 arranging the compensation region 52 is preferably not less than two and not more than ten. In a case where the compensation region 52 includes three or more impurity regions 24, as long as the condition that the p-type impurity concentration of the high concentration portion 55 exceeds the p-type impurity concentration of the low concentration portion 53 is provided, at least two among the three or more impurity regions 24 may have equal p-type impurity concentrations (peak concentrations). For example, the fourth to fifth impurity regions 24D to 24E may have equal p-type impurity concentrations.

As described above, in the column region 20 according to the second configuration example, the concentration gradient which deviates from the charge balance concentration Icb is introduced between the lower end portion 21 and the upper end portion 23 by the lower compensation region 50, the compensation region 52, and the upper compensation region 51. Therefore, in the column region 20 according to the second configuration example, the charge balance is not achieved over the entire region in the thickness direction. In the column region 20 according to the second configuration example, the charge balance with the drift region 6 is compensated at three points of the lower compensation region 50, the compensation region 52, and the upper compensation region 51.

Figure 7:
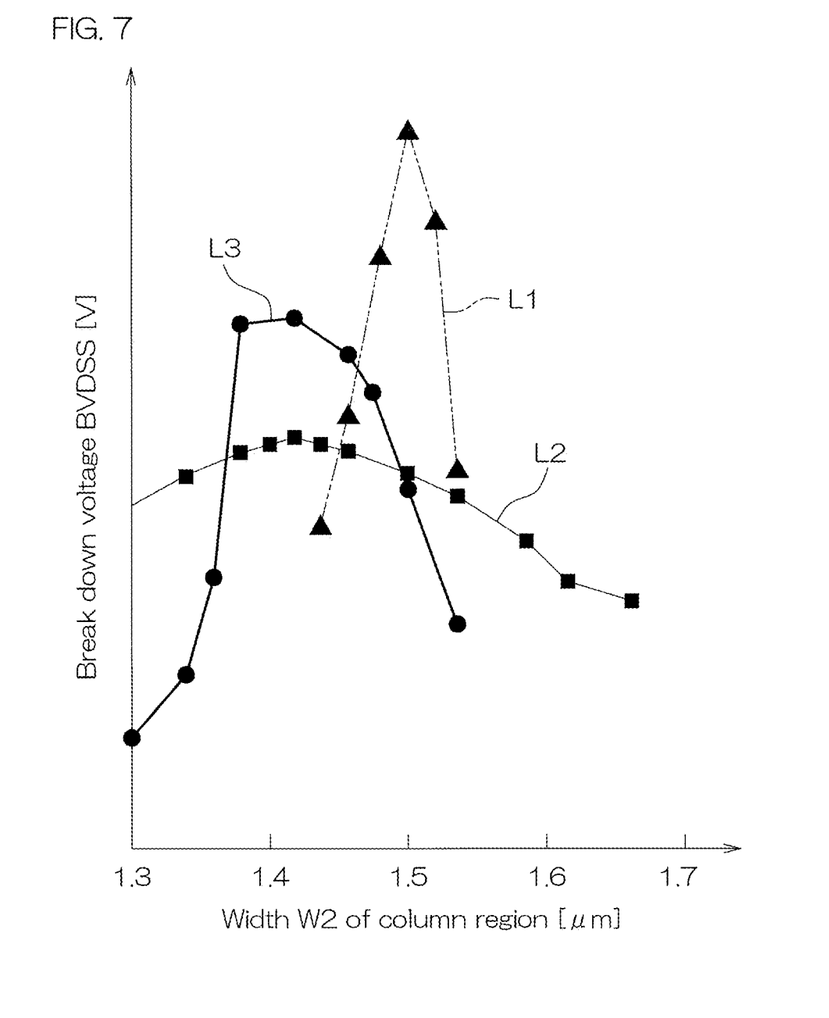
FIG. 7 is a graph in which measurement results of a breakdown voltage when the column region according to the second configuration example is adopted are reflected in FIG. 5.

FIG. 7 is a graph in which measurement results of the breakdown voltage BVDSS (actual measurement) when the column region 20 according to the second configuration example is adopted are reflected in FIG. 5. In FIG. 7, the vertical axis indicates the breakdown voltage BVDSS, and the horizontal axis indicates the second width W2 of the column region 20. FIG. 7 shows a process error generated in the column region 20.

FIG. 7 shows a third sequential line L3 (bold line) in addition to the first sequential line L1 (double chain line) and the second sequential line L2 (solid line) described above. The third sequential line L3 shows a result of a case where the column region 20 according to the second configuration example is formed. In the column region 20 according to the second configuration example, a designed value of the second width W2 with which the breakdown voltage BVDSS is maximized is approximately 1.42 µm.

With reference to the third sequential line L3, in a case of the column region 20 according to the second configuration example, in comparison to the column region 20 according to the comparative example, the breakdown voltage BVDSS is lowered. However, the change amount of the breakdown voltage BVDSS due to the process error becomes sluggish.

Meanwhile, in a case of the column region 20 according to the second configuration example, in comparison to the column region 20 according to the first configuration example, the change amount of the breakdown voltage BVDSS due to the process error becomes steep. However, the breakdown voltage BVDSS is improved. In such a way, it is found that, with the column region 20 according to the second configuration example, it is possible to suppress fluctuations in breakdown voltage BVDSS due to the process error while suppressing lowering of the breakdown voltage BVDSS.

The column region 20 according to the second configuration example includes the lower compensation region 50 on the lower end portion 21 side, and the upper compensation region 51 on the upper end portion 23 side. The lower compensation region 50 includes the low concentration portion 53 formed between the lower end portion 21 and the intermediate portion 22, and the lower high concentration portion 54 formed between the low concentration portion 53 and the lower end portion 21. Meanwhile, the upper compensation region 51 includes the high concentration portion 55 formed between the intermediate portion 22 and the upper end portion 23, and the upper low concentration portion 56 formed between the high concentration portion 55 and the upper end portion 23.

The lower compensation region 50 includes the low concentration portion 53 having a relatively low p-type impurity concentration between the lower end portion 21 and the intermediate portion 22 where an electric field easily is concentrated. Therefore, even when the second width W2 is increased more than the designed value due to the process error, it is possible to ease the electric field concentration on the lower end portion 21 by the low concentration portion 53.

Meanwhile, the upper compensation region 51 includes the high concentration portion 55 having a relatively high p-type impurity concentration between the intermediate portion 22 and the lower end portion 21 where an electric field easily is concentrated. Therefore, even when the second width W2 is decreased less than the designed value due to the process error, it is possible to ease the electric field concentration on the upper end portion 23 by the high concentration portion 55. As a result, it is possible to suppress fluctuations in breakdown voltage BVDSS due to the process error of the second width W2.

The lower compensation region 50 has the lower high concentration portion 54 positioned on the lower end portion 21 side of the low concentration portion 53. In the lower compensation region 50, the charge balance is compensated within an impurity concentration range between the low concentration portion 53 and the lower high concentration portion 54. Meanwhile, the upper compensation region 51 has the upper low concentration portion 56 positioned on the upper end portion 23 side of the high concentration portion 55. In the upper compensation region 51, the charge balance is compensated within an impurity concentration range between the high concentration portion 55 and the upper low concentration portion 56.

Therefore, with the column region 20 according to the second configuration example, it is possible to achieve the charge balance by the lower compensation region 50 on the lower end portion 21 side and the upper compensation region 51 on the upper end portion 23 side. As a result, it is possible to suppress the fluctuations in breakdown voltage BVDSS due to the process error of the second width W2 while suppressing the lowering of the breakdown voltage BVDSS. Therefore, it is possible to stably manufacture the semiconductor device 1 having the breakdown voltage BVDSS of not less than a fixed value.

The column region 20 according to the second configuration example further includes the compensation region 52 interposed between the lower compensation region 50 and the upper compensation region 51. In the compensation region 52, the charge balance is compensated within an impurity concentration range between the lower compensation region 50 and the upper compensation region 51. Thereby, it is possible to compensate the charge balance at three points of the lower compensation region 50, the upper compensation region 51, and the compensation region 52. Therefore, it is possible to properly suppress the fluctuations in breakdown voltage BVDSS due to the process error of the second width W2 while properly suppressing the lowering of the breakdown voltage BVDSS.

The present invention can further be implemented in other embodiments. For example, in the embodiment described above, the example in which the MISFET having the SJ structure is formed is described. However, the column regions 20 according to the first to second configuration examples are not limited to the MISFET but applicable to various devices having the SJ structure. The column regions 20 according to the first to second configuration examples may be applied to an SBD (Schottky Barrier Diode) having the SJ structure.

In the embodiment described above, the example in which the semiconductor chip 2 is made of the Si chip is described. However, the semiconductor chip 2 may be made of a wide-bandgap semiconductor chip. In this case, the semiconductor chip 2 may be made of a SiC (silicon carbide) chip.

In the embodiment described above, the example in which the plurality of column regions 20 are formed in a stripe shape in a plan view is described. However, the plurality of column regions 20 may be respectively formed in a circular shape or a polygonal shape in a plan view. In this case, the plurality of column regions 20 may be formed to be spaced from each other in the first direction X and the second direction Y in a plan view. The plurality of column regions 20, for example, may be arranged in a matrix in a plan view or may be arranged in a staggered arrangement.

Hereinafter, examples of features extracted from the present description and the drawings will be described. The following [A1] to [A18] provide a semiconductor device capable of suppressing fluctuations in withstand voltage due to a process error.

[A1] A semiconductor device comprising: a semiconductor chip having a main surface; a first conductivity type drift region formed in a surface layer portion of the main surface; and a second conductivity type column region formed in a column shape extending in a thickness direction in the drift region, the column region having a lower end portion, an intermediate portion and an upper end portion; wherein the column region has a compensation region including a low concentration portion which is formed between the lower end portion and the intermediate portion, and a high concentration portion which is formed between the intermediate portion and the upper end portion, the compensation region in which a charge balance is compensated within an impurity concentration range between the low concentration portion and the high concentration portion.

[A2] The semiconductor device according to A1, wherein the compensation region is formed such that an impurity concentration is increased from the low concentration portion toward the high concentration portion.

[A3] The semiconductor device according to A1 or A2, wherein the lower end portion is formed to be spaced from a bottom portion of the drift region.

[A4] The semiconductor device according to any one of A1 to A3, wherein the column region is arranged by a plurality of second conductivity type impurity regions laminated in a column shape in the thickness direction of the drift region.

[A5] The semiconductor device according to any one of A1 to A4, further comprising: a second conductivity type base region formed in a surface layer portion of the drift region; wherein the column region is formed in a region immediately below the base region in the drift region.

[A6] The semiconductor device according to A5, wherein the upper end portion is connected to the base region.

[A7] The semiconductor device according to A5 or A6, wherein the base region has a first width, and the column region has a second width which is less than the first width.

[A8] The semiconductor device according to any one of A5 to A7, further comprising: a first conductivity type drain region formed in a region immediately below the drift region in the semiconductor chip; a first conductivity type source region formed in a surface layer portion of the base region, the source region demarcating a channel region between the drift region and the source region; and a planar gate structure formed on the main surface to oppose the channel region.

[A9] The semiconductor device according to any one of A1 to A8, wherein the low concentration portion is formed to be spaced from the lower end portion on the intermediate portion side.

[A10] The semiconductor device according to any one of A1 to A9, wherein the high concentration portion is formed to be spaced from the upper end portion on the intermediate portion side.

[A11] The semiconductor device according to any one of A1 to A10, wherein the column region has a lower compensation region including the low concentration portion and a lower high concentration portion which is formed between the low concentration portion and the lower end portion, the lower compensation region in which a charge balance is compensated within an impurity concentration range between the low concentration portion and the lower high concentration portion.

[A12] The semiconductor device according to A11, wherein the lower compensation region is formed such that the impurity concentration is increased from the low concentration portion toward the lower high concentration portion.

[A13] The semiconductor device according to any one of A1 to A12, wherein the column region has an upper compensation region including the high concentration portion and an upper low concentration portion which is formed between the high concentration portion and the upper end portion, the upper compensation region in which a charge balance is compensated within an impurity concentration range between the high concentration portion and the upper low concentration portion.

[A14] The semiconductor device according to A13, wherein the upper compensation region is formed such that the impurity concentration is decreased from the high concentration portion toward the upper low concentration portion.

[A15] A semiconductor device comprising: a semiconductor chip having a main surface; a first conductivity type drift region formed in a surface layer portion of the main surface; and a second conductivity type column region formed in a column shape extending in a thickness direction in the drift region, the column region having a lower end portion, an intermediate portion and an upper end portion: wherein the column region has: a lower compensation region including a low concentration portion which is formed between the lower end portion and the intermediate portion and a lower high concentration portion which is formed between the low concentration portion and the lower end portion, the lower compensation region in which a charge balance is compensated within an impurity concentration range between the low concentration portion and the lower high concentration portion; and an upper compensation region including a high concentration portion which is formed between the intermediate portion and the upper end portion and an upper low concentration portion which is formed between the high concentration portion and the upper end portion, the upper compensation region in which a charge balance is compensated within an impurity concentration range between the high concentration portion and the upper low concentration portion.

[A16] The semiconductor device according to A15, wherein the lower compensation region is formed such that an impurity concentration is increased from the low concentration portion toward the lower high concentration portion.

[A17] The semiconductor device according to A15 or A16, wherein the upper compensation region is formed such that the impurity concentration is decreased from the high concentration portion toward the upper low concentration portion.

[A18] The semiconductor device according to any one of A15 to A17, wherein the high concentration portion has a higher concentration than the lower high concentration portion, and the upper low concentration portion has a higher concentration than the low concentration portion.

While the embodiment of the present invention is described in detail above, these are merely specific examples used to clarify the technical contents of the present invention and the present invention should not be interpreted as being limited to these specific examples and the scope of the present invention is limited by the appended claims.

REFERENCE SIGNS LIST

1 Semiconductor device
2 Semiconductor chip
3 First main surface
6 Drift region
7 Drain region
9 Base region
10 Source region
11 Channel region
20 Column region
21 Lower end portion
22 Intermediate portion
23 Upper end portion
25 Planar gate structure
40 Compensation region
41 Low concentration portion
42 High concentration portion
50 Upper compensation region
51 Lower compensation region
52 Compensation region
53 Low concentration portion
55 High concentration portion
W1 First width
W2 Second width

The invention claimed is:
1. A semiconductor device comprising:
a semiconductor chip having a main surface;
a first conductivity type drift region formed in a surface layer portion of the main surface; and
a second conductivity type column region formed in a column shape extending in a thickness direction in the drift region, the column region having a lower end portion, an intermediate portion and an upper end portion,
wherein the column region has:
a lower compensation region including a low concentration portion which is formed between the lower end portion and the intermediate portion and a lower high concentration portion which is formed between the low concentration portion and the lower end portion, the lower compensation region in which a charge balance is compensated within an impurity concentration range between the low concentration portion and the lower high concentration portion;
an upper compensation region including a high concentration portion which is formed between the interme- diate portion and the upper end portion and an upper low concentration portion which is formed between the high concentration portion and the upper end portion, the upper compensation region in which a charge balance is compensated within an impurity concentration range between the high concentration portion and the upper low concentration portion, and the upper low concentration portion has a higher concentration than the low concentration portion.

2. The semiconductor device according to claim 1, wherein the lower compensation region is formed such that an impurity concentration is increased from the low concentration portion toward the lower high concentration portion.

3. The semiconductor device according to claim 1, wherein the upper compensation region is formed such that the impurity concentration is decreased from the high concentration portion toward the upper low concentration portion.

4. The semiconductor device according to claim 1,
wherein the high concentration portion has a higher concentration than the lower high concentration portion.

5. The semiconductor device according to claim 1, wherein the lower end portion of the column region is formed to be spaced from a bottom portion of the drift region.

6. The semiconductor device according to claim 1, wherein the column region is arranged by a plurality of second conductivity type impurity regions laminated in a column shape in the thickness direction of the drift region.

7. The semiconductor device according to claim 1, further comprising:
a second conductivity type base region formed in a surface layer portion of the drift region,
wherein the column region is formed in a region immediately below the base region in the drift region.

8. The semiconductor device according to claim 7, wherein the upper end portion of the column region is connected to the base region.

9. The semiconductor device according to claim 7,
wherein the base region has a first width, and
the column region has a second width which is less than the first width.

10. The semiconductor device according to claim 7, further comprising:
a first conductivity type drain region formed in a region immediately below the drift region in the semiconductor chip;
a first conductivity type source region formed in a surface layer portion of the base region, the source region demarcating a channel region between the drift region and the source region; and
a planar gate structure formed on the main surface to oppose the channel region.

* * * * *